United States Patent
Savignac et al.

(10) Patent No.: US 7,548,476 B2
(45) Date of Patent: Jun. 16, 2009

(54) INTEGRATED CIRCUIT AND METHOD OF OPERATING SUCH A CIRCUIT

(75) Inventors: Dominique Savignac, Ismaning (DE); Helmut Schneider, Munich (DE)

(73) Assignee: Qimonda AG, Munich (DE)

( * ) Notice: Subject to any disclaimer, the term of this patent is extended or adjusted under 35 U.S.C. 154(b) by 386 days.

(21) Appl. No.: 11/566,553

(22) Filed: Dec. 4, 2006

(65) Prior Publication Data

US 2007/0153601 A1    Jul. 5, 2007

(30) Foreign Application Priority Data

Dec. 3, 2005    (DE) ........................ 10 2005 057 788

(51) Int. Cl.
*G11C 7/02* (2006.01)
(52) U.S. Cl. .................... 365/207; 365/189.09
(58) Field of Classification Search ............... 365/207, 365/189.09
See application file for complete search history.

(56) References Cited

U.S. PATENT DOCUMENTS

| | | | |
|---|---|---|---|
| 5,412,605 A | 5/1995 | Ooishi | |
| 6,104,655 A * | 8/2000 | Tanoi et al. | 365/205 |
| 6,229,745 B1 | 5/2001 | Nambu et al. | |
| 6,337,824 B1 * | 1/2002 | Kono et al. | 365/207 |
| 6,407,956 B2 * | 6/2002 | Ooishi | 365/205 |
| 2001/0015930 A1 | 8/2001 | Ooishi | |

FOREIGN PATENT DOCUMENTS

| | | |
|---|---|---|
| DE | 4406035 A1 | 9/1994 |
| JP | 02231760 | 9/1990 |
| JP | 04278295 A | 10/1992 |
| JP | 10214485 | 8/1998 |

* cited by examiner

*Primary Examiner*—Tuan T. Nguyen
(74) *Attorney, Agent, or Firm*—Patterson & Sheridan, L.L.P.

(57) ABSTRACT

An integrated circuit includes a bit line pair having two bit lines, a sense amplifier having at least one transistor, the sense amplifier amplifying a charge difference between the bit lines of the bit line pair; and a control unit connected to a substrate terminal of the at least one transistor, the control unit applying a substrate potential dependent on an operating state of the integrated circuit to the substrate of the at least one transistor.

38 Claims, 5 Drawing Sheets

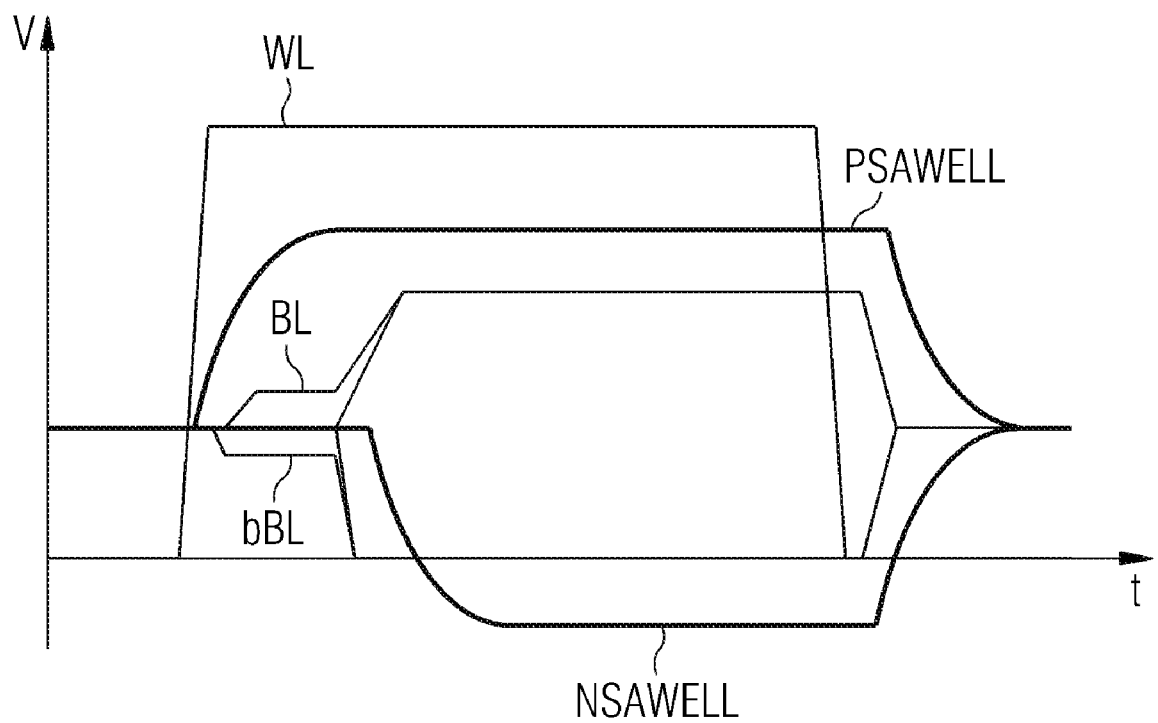

INTEGRATED CIRCUIT AND METHOD OF OPERATING SUCH A CIRCUIT

CROSS-REFERENCE TO RELATED APPLICATIONS

This application claims foreign priority benefits under 35 U.S.C. § 119 to co-pending German patent application number DE 10 2005 057 788.1-55, filed 3 Dec. 2005. This related patent application is herein incorporated by reference in its entirety.

BACKGROUND OF THE INVENTION

1. Field of the Invention

The invention relates to an integrated circuit, a memory circuit, in particular a dynamic random access memory (DRAM) circuit, and to a method for operating an integrated circuit, in particular for driving a sense amplifier of the dynamic memory circuit.

2. Description of the Related Art

One requirement made of an integrated circuit, in particular DRAM memory components involves reducing the operating voltage ever further. As the operating voltage of a DRAM memory circuit decreases, the operating point of present-day conventional sense amplifiers is shifted toward ever lower voltages. At the same time, the threshold voltage of the transistors used therein correspondingly decreases, but the reverse current of the transistor rises exponentially as the threshold voltage decreases. Therefore, it is possible for the threshold voltage to be lowered only as far as a specific minimum value, in order to prevent the reverse current from rising above a maximum value. If the minimum value of the threshold voltage is reached, the operating conditions of the sense amplifier can no longer be set in a suitable manner upon further reduction of the supply voltage.

The operating points of the transistors of the sense amplifier have hitherto been realized either by a suitable choice of the threshold voltages of the transistors or by regulation of said threshold voltages such that the dynamic properties and at the same time the blocking behavior, too, have sufficed for operation of the memory circuit. However, this becomes more difficult as the supply voltages decrease further.

Furthermore, a decreasing operating voltage of a DRAM memory circuit has the effect of reducing the gain of the sense amplifier, with the result that the dynamic behavior of the memory circuit deteriorates.

SUMMARY OF THE INVENTION

Various aspects of the present invention can provide particular advantages for an integrated circuit, a memory circuit and a method of operating an integrated circuit.

According to a first embodiment of the invention, an integrated circuit comprises a bit line pair having two bit lines, a sense amplifier having at least one transistor, the sense amplifier amplifying a charge difference between the bit lines of the bit line pair, and a control unit connected to a substrate terminal of the at least one transistor, the control unit applying a substrate potential dependent on an operating state of the integrated circuit to the substrate of the transistor.

According to a second embodiment of the invention, a memory circuit comprises a bit line pair having two bit lines, a memory cell having a storage capacitance and a selection transistor, the selection transistor, upon activation, connecting the storage capacitance to one of the bit lines, thereby bringing about a charge difference between the bit lines of the bit line pair, a sense amplifier having at least one transistor, the sense amplifier amplifying a charge difference between the bit lines of the bit line pair, and a control unit connected to a substrate terminal of the at least one transistor, the control unit applying a substrate potential dependent on an operating state of the memory circuit to the substrate of the transistor.

According to a third embodiment of the invention, a method of operating a integrated circuit comprising a bit line pair having two bit lines, a memory cell having a storage capacitance and having a selection transistor, and a sense amplifier having at least one transistor is provided. The method comprises amplifying a charge difference between the bit lines of the bit line pair, and applying a substrate potential dependent on an operating state of the integrated circuit to the substrate of the transistor.

BRIEF DESCRIPTION OF THE DRAWINGS

These above recited features of the present invention will become clear from the following description, taking in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

FIG. 8 shows a signal-time diagram for illustrating the profile of the substrate potential of an n-channel field effect transistor and of a p-channel field effect transistor of the sense amplifier depending on the operating state of the memory circuit in accordance with a seventh embodiment of the invention.

DETAILED DESCRIPTION OF THE PREFERRED EMBODIMENT

Figure 1:
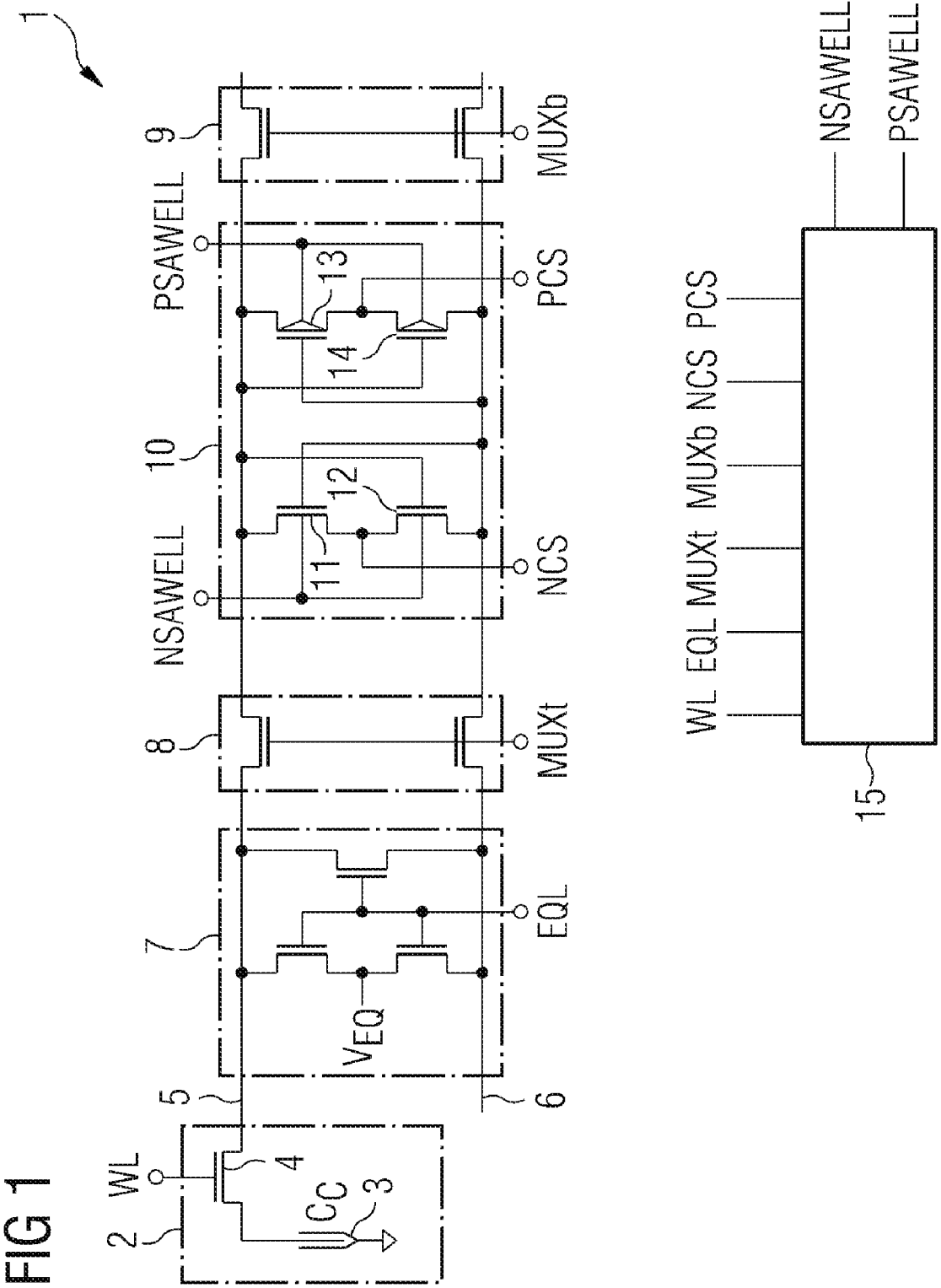
FIG. 1 shows a circuit diagram of a detail from a dynamic memory circuit in accordance with embodiments of the present invention.

FIG. 1 illustrates a circuit diagram of a detail from the memory circuit 1 according to embodiments of the invention. The memory circuit has a dynamic memory cell 2 comprising a storage capacitance 3 and a selection transistor 4. The storage capacitance 3 is connected to a defined potential, in particular a center potential, by one terminal. A further terminal of the storage capacitance is connected to a first terminal of the selection transistor 4, and a second terminal of the selection transistor 4 is connected to a first bit line 5 of a bit line pair. An activation signal can be applied to a control terminal of the selection transistor 4 in order to address the memory cell for writing, for read-out or for refreshing.

The first bit line 5 together with a second bit line 6 form the bit line pair. The bit lines are connected to an equalization unit 7, which equalizes the potentials on the first and second bit lines 5, 6 depending on an equalize signal EQL and brings them to an equalize potential $V_{EQ}$. The equalization unit is activated when the selection transistor 4 of the memory cell 2 is deactivated. The equalization unit 7 is deactivated, however, when the memory cell 2 is read, written to or refreshed, so that a detectable charge difference can form on the bit lines 5, 6 of the bit line pair.

Furthermore, the bit lines 5, 6 of the bit line pair have a first switching device 8 and a second switching device 9, which can be activated by means of a first switching signal MUXt and a second switching signal MUXb, respectively. The first switching device 8 serves for feeding a charge difference that exists on the bit line pair to a sense amplifier 10. The second switching device 9 serves for making available the potential difference—amplified by the sense amplifier 10—on the bit lines 5, 6 of the bit line pair as read-out datum, e.g., for a data selection unit. The further processing of the read-out datum is known from the conventional art, and it is not discussed any further herein. Furthermore, the second switching device 9 may also be connected to a further bit line pair, so that the sense amplifier 10 can be used with a split bit line.

The sense amplifier 10 has a first and a second n-channel field effect transistor 11, 12, which are connected in series between the first bit line 5 and the second bit line 6. That is to say that a first terminal of the first n-channel field effect transistor is connected to the first bit line, and a first terminal of the second n-channel field effect transistor is connected to the second bit line 6. Second terminals of the two n-channel field effect transistors 11, 12 are connected to one another and to a first drive signal NCS. A control terminal of the first n-channel field effect transistor 11 is connected to the second bit line, and a control terminal of the second n-channel field effect transistor 12 is connected to the first bit line. The substrates of the first and second n-channel field effect transistors 11, 12 can be connected to a controllable first substrate potential NSAWELL. The substrate terminal of the n-channel field effect transistors corresponds to the back gate terminal for applying a back bias voltage.

Furthermore, the sense amplifier 10 has a first and a second p-channel field effect transistor 13, 14, which are connected in series between the first and second bit lines 5, 6. That is to say that a first terminal of the first p-channel field effect transistor 13 is connected to the first bit line 5, and a first terminal of the second p-channel field effect transistor 14 is connected to the second bit line 6. Second terminals of the p-channel field effect transistors 13, 14 are connected to one another and to a second drive signal PCS. A control terminal of the first p-channel field effect transistor 13 is connected to the second bit line 6, and a control terminal of the second p-channel field effect transistor 14 is connected to the first bit line 5. The substrate terminals of the first and second p-channel field effect transistors 13, 14 are connected to a second substrate potential PSAWELL.

The first and second n-channel field effect transistors 11, 12 and also the first and second p-channel field effect transistors 13, 14 are produced in an integrated manner and may be situated in a doping well in the wafer substrate in which the memory circuit is formed. The substrate potential is therefore applied to the doping wells of the n-channel field effect transistors 11, 12 and the p-channel field effect transistors 13, 14 of the sense amplifier 10.

The signals of the memory circuit are provided by a control unit 15, which may comprise the peripheral circuits of the memory circuit, such as e.g. address decoders, voltage sources, signal controllers and the like, which are usually provided in the case of DRAM circuits. The control unit 15 makes available the activation signal to WL, the equalize signal EQL, the first switching signal MUXt, the second switching signal MUXb, the first drive signal NCS, the second drive signal PCS, the first substrate potential NSAWELL and the second substrate potential PSAWELL in a suitable manner described comprehensively below.

The operation of such a memory circuit, in particular a read-out of the memory cell, is described below. As long as the activation signal WL is inactive, that is to say that the selection transistor 4 is open, the memory circuit is in an inactive operating state. In the inactive operating state, the equalize signal EQL activates the equalization device, so that both bit lines 5, 6 of the bit line pair are applied to an equalize potential $V_{EQ}$ and are short-circuited with one another, with the result that the same charge potential is situated on both bit lines. The first and second switching devices 8, 9 are open.

Upon the activation of the activation signal, i.e. the selection transistor is closed, charge flows onto the first bit line, with the result that a potential difference forms on the two bit lines 5, 6 of the bit line pair. Simultaneously or shortly beforehand, the equalize signal is deactivated, so that the equalization device 7 is switched off, and both bit lines 5, 6 are isolated from the equalize potential $V_{EQ}$ and from one another. Likewise simultaneously or shortly before the activation of the activation signal, the second switching device 9, which was closed in the deactivated state, is opened, so that only the first switching device 8 is closed. The potential difference of the bit lines is now present at the sense amplifier 10. The sense amplifier 10 amplifies the potential difference by pulling the bit line having the higher potential in the direction of a high bit line potential, e.g. in the direction of the supply voltage VDD with which the memory circuit is operated, and the bit line on which the lower potential is situated in the direction of a low bit line potential, preferably a ground potential. The read-out of the memory cell 2 with the aid of the sense amplifier 10 takes place in two phases. During an amplifying phase, the charge potentials are separated to the high and the low bit line potential and, during a hold phase, the bit line potentials amplified in this way are held for a specific time duration during which the amplified potential difference between the high and low bit line potentials can be read out.

During the amplifying phase, firstly the first and second drive signals NCS and PCS are held at a center potential, which preferably corresponds to the equalize potential $V_{EQ}$. After a specific time duration, the first drive signal is pulled in the direction of the low bit line potential and the second drive signal PCS is pulled in the direction of the high bit line potential in order to support the amplification of the sense amplifier, with the result that the process of separating the potentials on the bit lines is effected.

While it is usually provided that the substrate potentials of n-channel field effect transistors in a DRAM memory circuit are at the lowest potential of the memory circuit and the substrate potentials of the p-channel field effect transistors of the memory circuit are at the highest potential in the memory circuit, embodiments of the invention provide for applying the substrate potential depending on the operating state, i.e. inactive state, the gain phase and the hold phase of the active state. That is to say that a variable substrate potential is provided for the n-channel field effect transistors 11, 12 and/or the p-channel field effect transistors 13, 14 of the sense amplifier 10.

Figure 2:
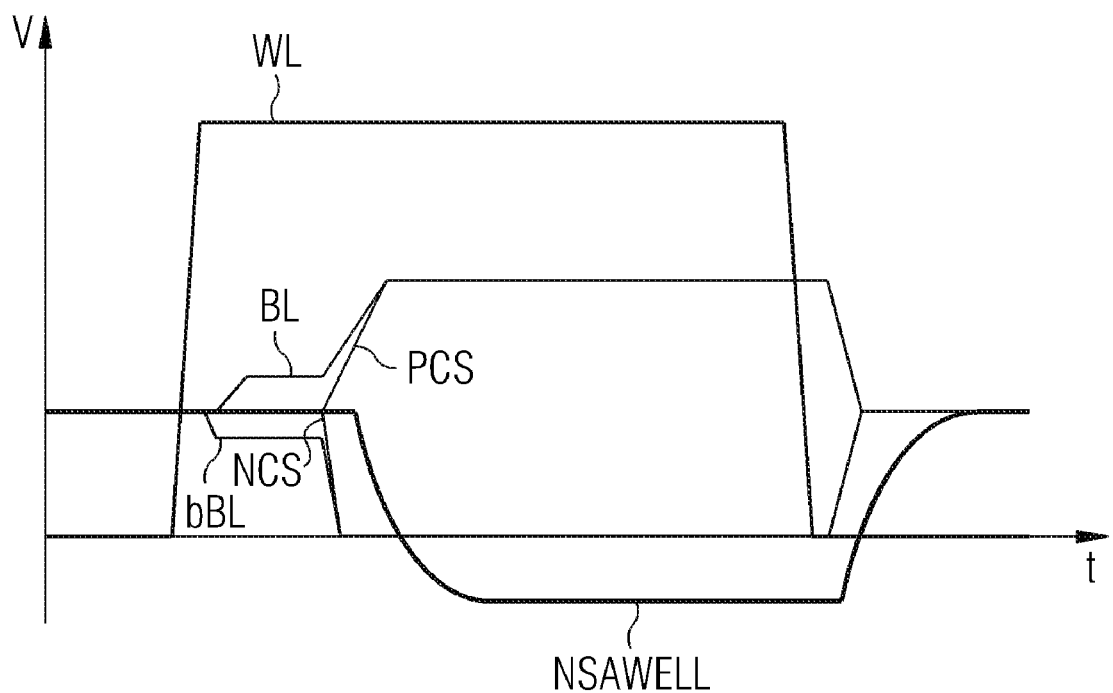
FIG. 2 shows a signal-time diagram for illustrating the profile of the substrate potential of an n-channel field effect transistor and of a p-channel field effect transistor of the sense amplifier depending on the operating state of the memory circuit in accordance with a first embodiment.

The control of the memory circuit 1 is explained in more detail below on the basis of the signal-time diagrams in FIGS. 2 to 8. FIG. 2 illustrates the control of the memory circuit in accordance with a first embodiment. In the inactive state of the memory circuit, that is to say in a case where the activation signal WL is deactivated, the first substrate potential, that is to say the substrate potential for the n-channel field effect transistors 11, 12 of the sense amplifier 10, has been/is put at a center potential between the high and low bit line potentials to which each of the bit lines can be brought by means of the amplification process. The center potential may correspond exactly to the potential in the middle between the high and low bit line potentials. Usually, the high bit line potential corresponds to the high supply voltage potential and the low bit line potential corresponds to the ground potential, so that the center potential corresponds to half of the supply voltage. Consequently, in the inactive state of the memory circuit, the center potential is present at the bit lines 5, 6 and at the substrate terminals of the n-channel field effect transistors 11, 12 of the sense amplifier 10, so that no leakage current can flow between the bit lines and the substrates of the n-channel field effect transistors 11, 12 since no potential gradient is present. However, this procedure is only possible if half of the supply voltage is significantly less than the diode kink voltage, which is usually at approximately 0.7 volt. This prerequisite is provided at supply voltages of below 1.2 V. The center potential can be provided by a voltage source which also supplies the voltage of the first terminal of the storage capacitance 3 or for the equalize potential $V_{EQ}$. Since the sense amplifier 10 is connected to the center potential by all its terminals in the inactive state, e.g. $V_{EQ}$ on the bit lines and the center potential, which preferably corresponds to the equalize potential, at the substrate terminal, all potential leakage currents are eliminated in the sense amplifier 10 in the inactive state.

During the amplifying phase when reading from the memory cell 2, firstly the substrate potential of the n-channel field effect transistors 11, 12 is held at the center potential, so that the sense amplifier 10 has a favorable behavior during dynamic operation. In the amplifying phase, the n-channel field effect transistors 11, 12 then have a considerably enlarged drain current by comparison with normal operation, whereby it is possible to effect a significantly faster evaluation (amplification) of the potential difference on the bit lines 5, 6. In the amplifying phase, the first and second drive signals NCS and PCS are pulled to the low and high bit line potential, respectively, in order to bring about the amplification of the potential difference on the bit lines 5, 6. Within the time period between the beginning of the edges of the first and second drive signals and the attainment of the high and low bit line potentials, respectively, on the bit lines, the first substrate potential for the substrates of the n-channel field effect transistors 11, 12 is pulled from the center potential in the direction of the low bit line potential or a potential that is lower than the low bit line potential, as is illustrated in FIG. 2. This has the effect that in the hold phase during which the bit line potentials are held at the high and the low bit line potential, in order to read out the memory datum, the reverse current of the sense amplifier 10 is minimized. In particular, it is possible to regulate the first substrate potential of the sense amplifier 10, which is present at the n-channel field effect transistors 11, 12, depending on the temperature or on process fluctuations during the production process. The minimalization of the reverse currents of the n-channel field effect transistors 11, 12 of the sense amplifier 10 reduces the current consumption of the memory circuit.

Before, during or after the deactivation of the activation signal WL, the bit lines 5, 6 are brought to the equalize potential again and the substrate potentials of the n-channel field effect transistors 11, 12 are raised to the center potential, with the result that the inactive state described above is reached, in which the leakage currents of the memory circuit are minimized as much as possible. Inter alia, the resultant displacement current generated by the change in the substrate potential can be fed from the current source with which the sense amplifier is supplied in the event of return to the center potential before or during the deactivation. The subsequent bit line precharge process is considerably accelerated as a result.

A further significant advantage provided by embodiments of the present invention consists in the fact that the n-channel field effect transistors 11, 12 are operated at a positive substrate potential during the read-out process. This reduces the threshold voltage at the operating point, as a result of which the threshold voltage given 0 V at the substrate can be chosen to be higher than normal. As a result, it is possible to increase the dopant concentration in the well, that is to say the substrates of the transistors, as a result of which the stochastic fluctuation of the parameters of the transistors of the sense amplifier 10 is reduced.

Figure 3:
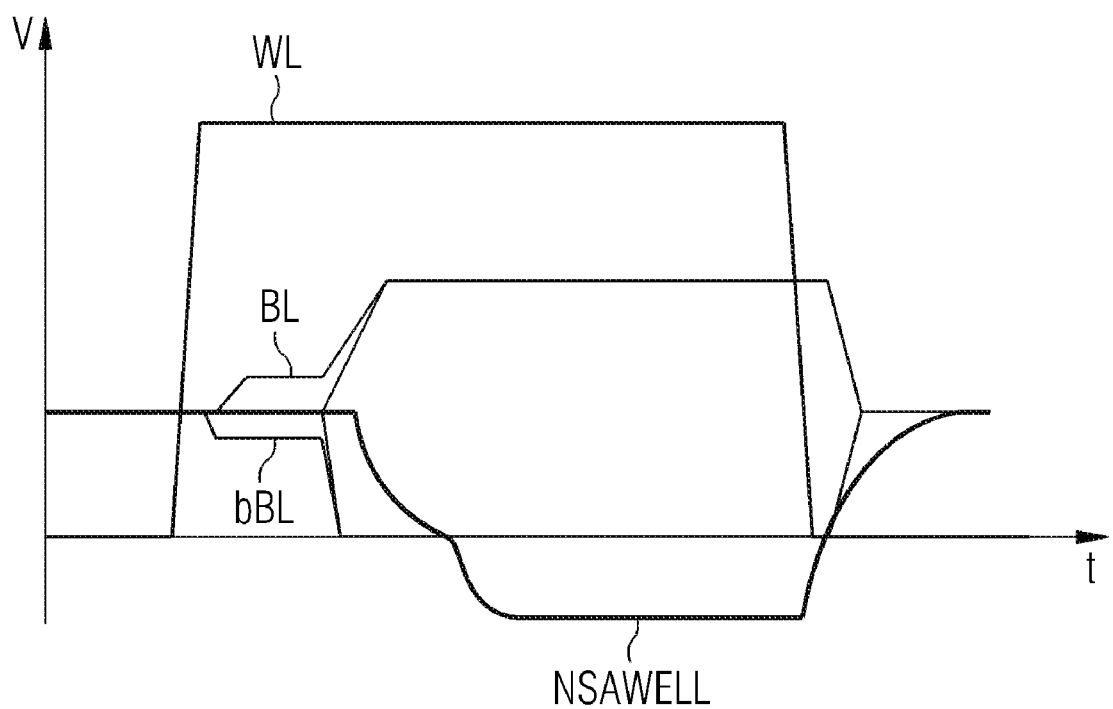
FIG. 3 shows a signal-time diagram for illustrating the profile of the substrate potential of an n-channel field effect transistor and of a p-channel field effect transistor of the sense amplifier in accordance with a further embodiment of the invention.

In accordance with a second embodiment of the invention shown in FIG. 3, the substrate potential of the n-channel field effect transistors 11, 12 is brought in two stages to a reduced potential by comparison with the low bit line potential. That is to say that the substrate potential is lowered during the amplifying phase as described above, but firstly to the low bit line potential, and after the low bit line potential has essentially been reached, the latter is reduced further to a potential that is lower than the low bit line potential. This is particularly current-saving since the low bit line potential is preferably a ground potential provided as supply potential having high driver power. Since a high current flows at the beginning of the process of switching the substrate potential, it is expedient not to have to make this current available by means of a charge pump which provides the decreased potential by comparison with the low supply potential. The two-stage lowering of the substrate potential has the effect that the charge of the substrates of the n-channel field effect transistors 11, 12 firstly flows away toward the ground potential, that is to say the low bit line potential, and afterward only the potential difference between the low bit line potential and the decreased potential with respect thereto has to be generated. It is thereby possible to considerably reduce the current consumption in the control of the substrate potentials.

Figure 4:
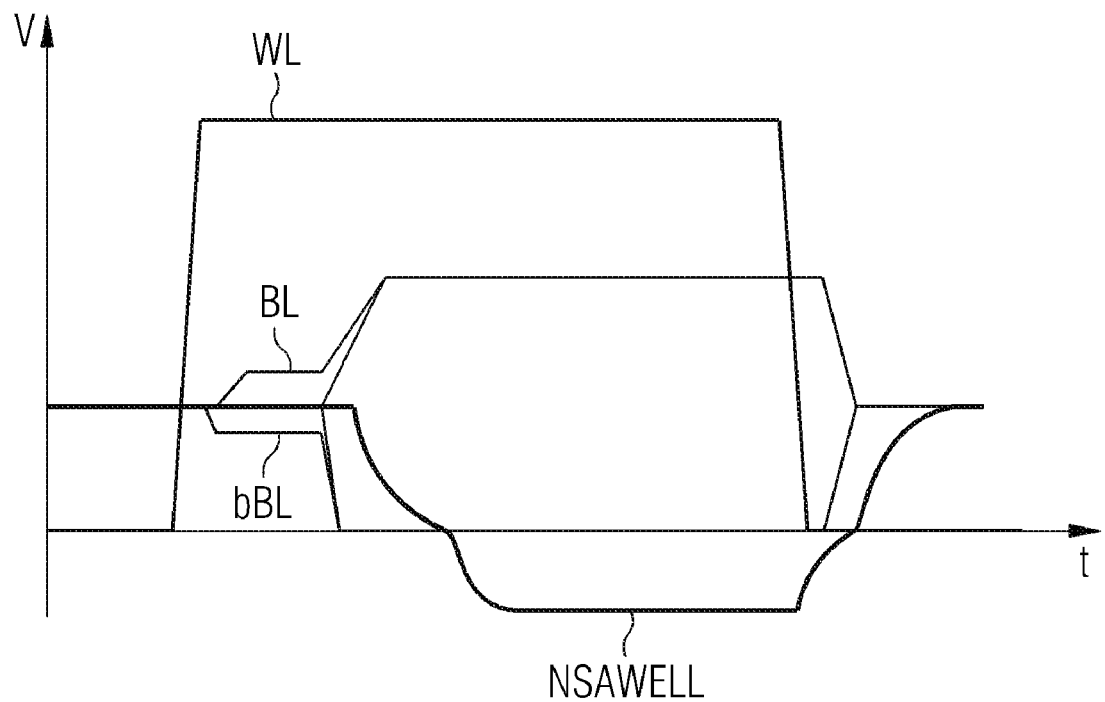
FIG. 4 shows a signal-time diagram for illustrating the profile of the substrate potential of an n-channel field effect transistor and of a p-channel field effect transistor of the sense amplifier depending on an operating state of the memory circuit in accordance with a third embodiment of the invention.

In accordance with a third embodiment illustrated in FIG. 4, this two-stage adaptation of the substrate potential is also provided in the case where the memory circuit is deactivated. That is to say that in the case where the activation signal WL is deactivated, the first substrate potential at the n-channel field effect transistors 11, 12 is firstly raised to the low bit line potential, and subsequently to the center potential.

Figure 5:
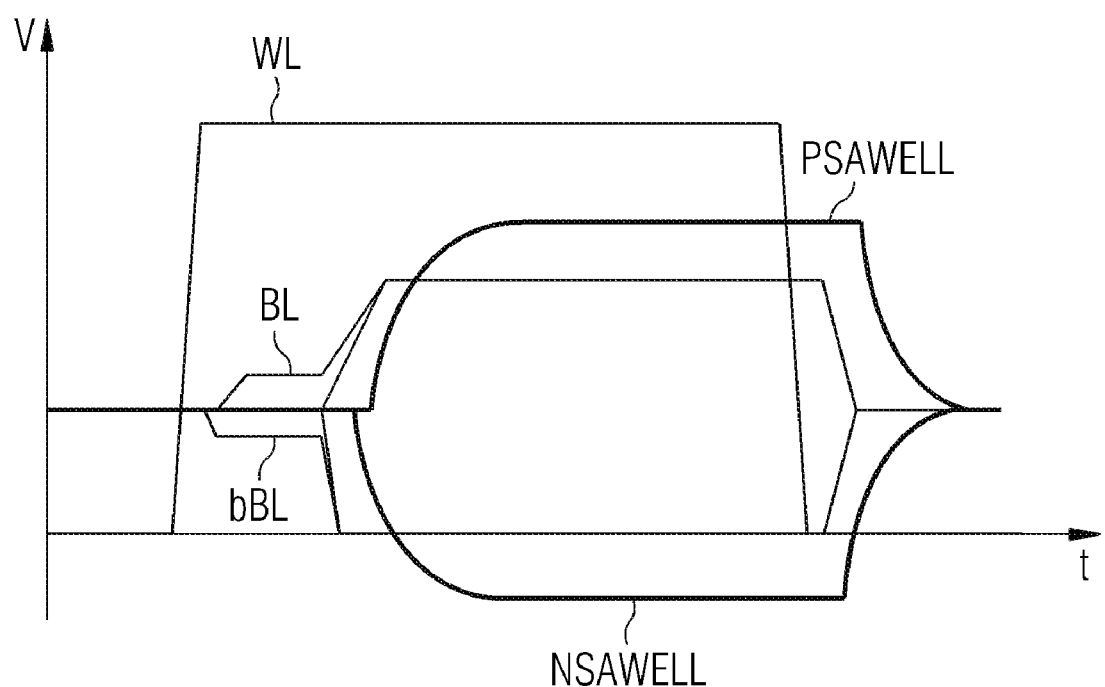
FIG. 5 shows a signal-time diagram for illustrating the profile of the substrate potentials of an n-channel field effect transistor and of a p-channel field effect transistor of the sense amplifier depending on the operating state of the memory circuit in accordance with a fourth embodiment of the invention.

In accordance with a fourth embodiment shown in FIG. 5, provision is then made for varying the substrate potential of the p-channel field effect transistors 12, 13 likewise depending on the operating state. With regard to the control of the first substrate potential for the n-channel field effect transistors, the fourth embodiment corresponds to the first embodiment. The control of the second substrate potential for the p-channel field effect transistors 13, 14 is essentially effected analogously to the control of the first substrate potential for the n-channel field effect transistors 11, 12, in which case, during the amplifying phase, the second substrate potential is raised to the high bit line potential or to an increased potential by comparison with the high bit line potential. In the case where the memory circuit 1 is deactivated, the second substrate potential is correspondingly lowered from the high bit line potential or from the increased potential to the center potential. The center potentials of the first and second substrate potentials preferably correspond to one another, but they may also be chosen to be different from one another. In particular, it may be provided that the raising of the second substrate potential is effected in a temporally offset manner with respect to the lowering of the first substrate potential during the amplifying phase.

Figure 6:
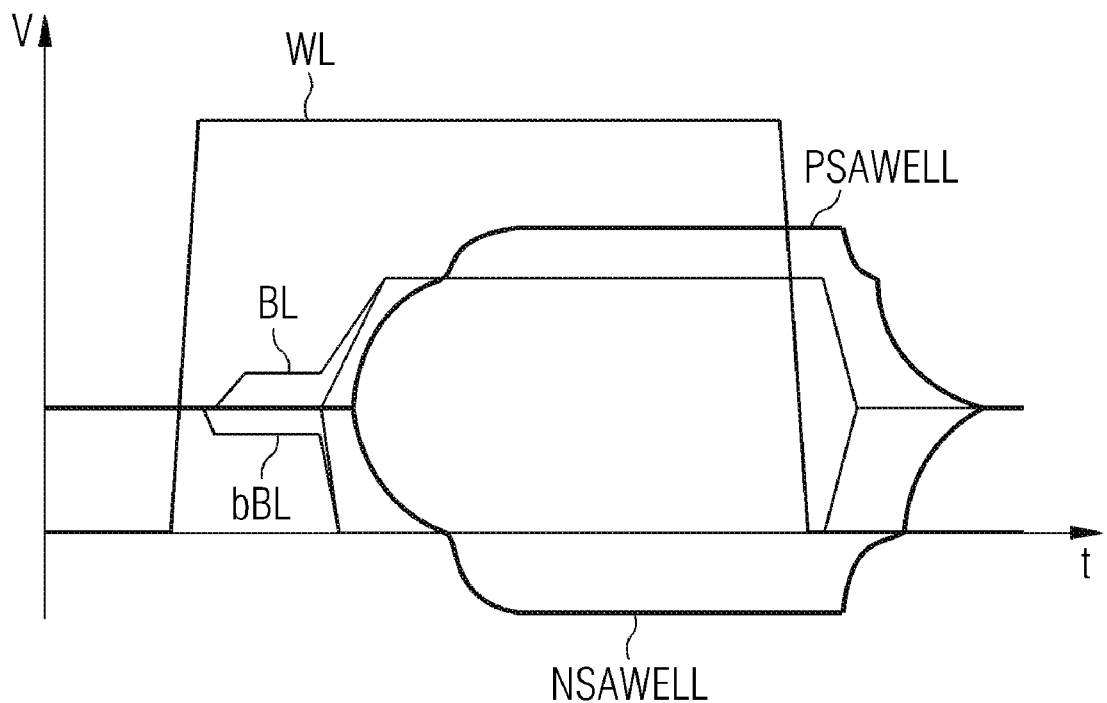
FIG. 6 shows a signal-time diagram for illustrating the profile of the substrate potentials of an n-channel field effect transistor and of a p-channel field effect transistor of the sense amplifier depending on the operating state of the memory circuit in accordance with a fifth embodiment of the invention.

The fifth embodiment, illustrated in FIG. 6, corresponds to the third embodiment, illustrated in FIG. 4, with regard to the control of the first substrate potential. The second substrate potential is controlled correspondingly analogously to the control of the first substrate potential, that is to say is raised or lowered in two stages. In other words, at the instant when the first substrate potential is lowered, the second substrate potential is firstly brought to the high bit line potential and is subsequently raised from the high bit line potential to an increased potential with respect thereto. Correspondingly, in the case where the substrate potential is lowered during or after the deactivation of the memory circuit, the second substrate potential is firstly lowered to the high bit line potential and subsequently lowered to the center potential.

Figure 7:
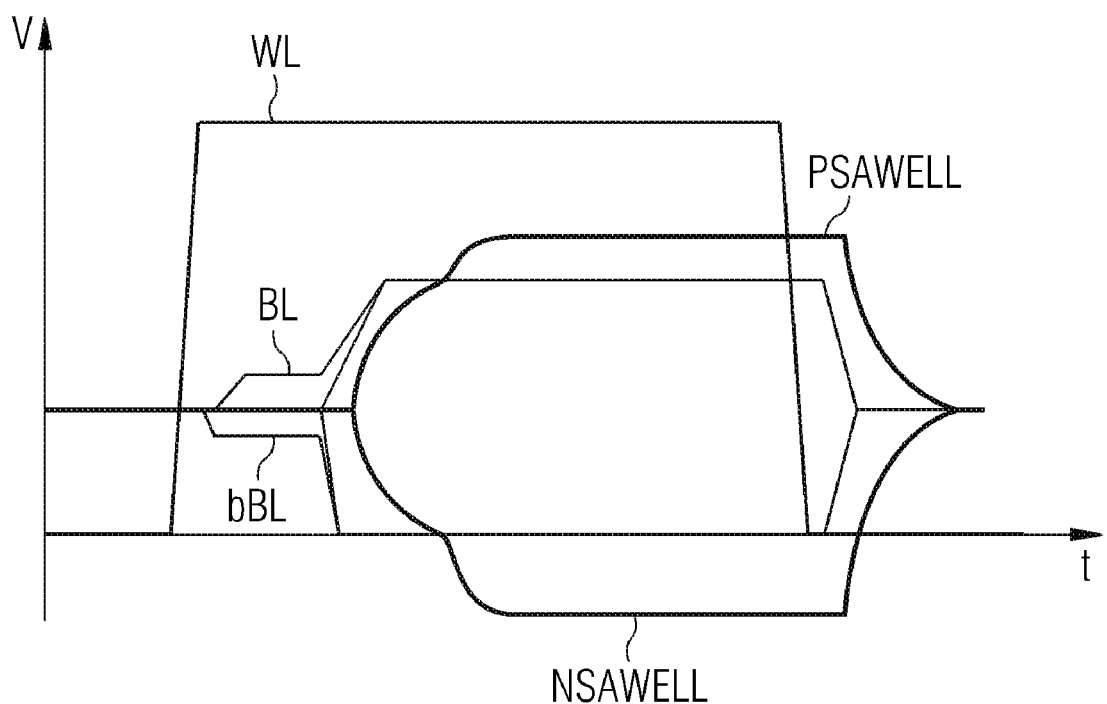
FIG. 7 shows a signal-time diagram for illustrating the profile of the substrate potential of an n-channel field effect transistor and of a p-channel field effect transistor of the sense amplifier depending on the operating state of the memory circuit in accordance with a sixth embodiment of the invention.

A sixth embodiment of the invention shown in FIG. 7 corresponds to the second embodiment of the invention with regard to the control of the first substrate potential, the profile of the second substrate potential being controlled in a manner corresponding to the profile of the first substrate potential. That is to say that the second substrate potential is raised in two stages firstly to the high bit line potential and subsequently to an increased potential relative to the high bit line potential, and is subsequently lowered once to the center potential.

In accordance with a seventh embodiment of the invention, as is illustrated by the signal-time diagram in FIG. 8, the control of the first substrate potential corresponds to that illustrated with regard to the first embodiment in FIG. 2. In contrast to the previous embodiments, however, the second substrate potential is already raised to an increased potential relative to the high bit line potential, or to the high bit line potential, at the beginning of the amplifying phase, that is to say at the beginning of the evaluation by the sense amplifier 10. As a result, a favorable read-out behavior can be obtained, thereby reducing the proportion of p-channel field effect transistors 13, 14 in the actual evaluation.

The present invention is applicable not only to a memory circuit, in particular a DRAM memory circuit, but to all types of integrated memory. According to embodiments of the present invention, the reverse current of the sense amplifier may be reduced in the activated state, and leakage currents may be reduced in the inactive state of the sense amplifier. Furthermore, it may ensure that the sense amplifier has a favorable behavior during dynamic operation, that is to say that it is possible to accelerate the evaluation process for reading from a memory cell.

According to embodiments of the present invention, a dynamic memory circuit comprises a bit line pair having two bit lines, a memory cell having a storage capacitance and a selection transistor in order upon activation, to connect the storage capacitance to one of the bit lines, thereby bringing about a charge difference between the bit lines of the bit line pair, and a sense amplifier having at least one transistor in order to amplify the charge difference brought about. With the aid of a control unit connected to a substrate terminal of the transistor, a substrate potential dependent on the operating state of the memory circuit is applied to the substrate of the transistor.

The memory circuit according to embodiments of the present invention may have the advantage that the substrate potential can be applied to the substrate of the transistor (back gate, back bias) of the sense amplifier depending on the operating state, so that the relevant transistor can be operated at an optimized operating point in every operating state. The adaptation of the substrate potential depending on the operating state makes it possible, for example, to reduce the leakage current in an inactive state of the sense amplifier, to accelerate the amplification of a charge difference on the bit line pair and to reduce the current consumption when holding the charge difference in the case where a sense amplifier is activated.

The control unit may apply a first or a second substrate potential to the substrate of the transistor depending on the operating state.

In accordance with embodiments of the present invention, the sense amplifier may be able to be activated in order to bring one of the bit lines to a high bit line potential and the corresponding other bit line to a low bit line potential, the control unit being configured for applying a center potential to the substrate of the transistor at least in the case where the sense amplifier is inactivated, the center potential lying between the high and low bit line potentials. The choice of the center potential between the high and low bit line potentials advantageously makes it possible to reduce the reverse current through the transistor of the sense amplifier in the case where the sense amplifier is inactivated, owing to the minimization or elimination of the flow of potential leakage currents in the sense amplifier on account of the lack of potential differences.

In particular, the center potential may be chosen such that a leakage current of the transistor in the case where the sense amplifier is inactivated does not exceed a predetermined threshold value.

In accordance with embodiments of the present invention, the control unit may have a potential setting unit for setting the potentials of the bit lines of the bit line pair to an equalize potential in the case where the selection transistor is deactivated, the center potential corresponding to the equalize potential. Since the transistor of the sense amplifier is connected to a bit line by one terminal, no leakage current can flow between the substrate of the transistor and the terminal since both the terminal and the substrate of the transistor of the sense amplifier are at the same potential, namely the equalize or center potential.

The sense amplifier may be configured with the purpose, in the case where the selection transistor is activated, of bringing the bit lines of the bit line pair to a correspondingly high and low bit line potential in an amplifying phase and of holding the bit lines at the corresponding bit line potentials in a subsequent hold phase.

In accordance with the present invention, the sense amplifier my have at least one n-channel field effect transistor. In particular, the control unit is configured for bringing the substrate potential of the at least one n-channel field effect transistor to a second potential, which is less than the center potential, in particular less than or equal to the low bit line potential, at least during the hold phase.

As an alternative, the control unit may be configured for bringing the substrate potential of the at least one n-channel field effect transistor, at least during the hold phase, firstly to the low bit line potential and, after a first time duration, bringing the substrate potential to a second potential, which is less than the low bit line potential. This has the advantage that firstly, in the amplifying phase, sufficient drain current can flow through the transistor in order to achieve a fastest possible charge separation on the bit lines. The provision of the second potential, which is less than the low bit line potential, makes it possible to bring about a sufficiently great blocking behavior of the transistor, thereby reducing the reverse current through the transistor in order to limit the current consumption of the memory circuit.

The control unit may be configured for bringing the substrate potential of the at least one n-channel field effect transistor to the center potential after deactivation of the sense amplifier. The return to the center potential may also be effected before or after the deactivation of the sense amplifier. In this case, the resultant displacement current generated by the change in the substrate potential may be fed from the current sources of the sense amplifier in the event of the return before or during the deactivation. As a result, the subsequent bit line pre-charge process is considerably accelerated. A return after the deactivation ensures that the rewritten cell information is not disturbed.

As an alternative, provision may be made for the control unit to bring the substrate potential of the at least one n-channel field effect transistor, in a case where the sense amplifier is deactivated, firstly to the low bit line potential and, after a further predetermined time duration, to bring it to the center potential.

In accordance with the present invention, the sense amplifier may have a first and a second n-channel field effect transistor, which are connected in series between the first and second bit lines, the first n-channel field effect transistor is connected by a first terminal to the first bit line and the second n-channel field effect transistor is connected by a second terminal to the second bit line, second terminals of the n-channel field effect transistors being connected to one another and to a first read-out signal, a control terminal of the first n-channel field effect transistor being connected to the second bit line and a control terminal of the second n-channel field effect transistor being connected to the first bit line, the control unit being configured for lowering the first read-out signal during the amplifying phase from the center potential in the direction of the low bit line potential.

In accordance with the present invention, the sense amplifier may have at least one p-channel field effect transistor. In particular, the control unit is configured for bringing the substrate potential of the at least one p-channel field effect transistor to a third potential, which is greater than the center potential, in particular greater than or equal to the high bit line potential, at least during the hold phase.

As an alternative, the control unit may be configured for bringing the substrate potential of the at least one p-channel field effect transistor, at least during the hold phase, firstly to the high bit line potential and subsequently bringing it to a third potential, which is greater than the high bit line potential.

The control unit may be configured for bringing the substrate potential of the at least one p-channel field effect transistor to the center potential in the case where the sense amplifier is deactivated. As an alternative, the control unit may bring the substrate potential of the at least one p-channel field effect transistor, in the case where the sense amplifier is deactivated, firstly to the high bit line potential and, after a fourth predetermined time duration, bring it to the center potential. The return to the center potential may also be effected before and after the deactivation, as described above.

In accordance with the present invention, the sense amplifier may have a first and a second p-channel field effect transistor, which are connected in series between the first and second bit lines. The first p-channel field effect transistor is connected by a first terminal to the first bit line, and the second p-channel field effect transistor is connected by a second terminal to the second bit line. Second terminals of the p-channel field effect transistors are connected to one another and to a second read-out signal, a control terminal of the first p-channel field effect transistor being connected to the second bit line and a control terminal of the second p-channel field effect transistor being connected to the first bit line, the control unit being configured for lowering the second read-out signal during the amplifying phase from the center potential in the direction of the high bit line potential.

According to embodiments of the present invention, the dynamic memory circuit comprises a bit line pair having two bit lines, a memory cell having a storage capacitance and having a selection transistor, and a sense amplifier having at least one transistor. A method for operating the dynamic memory circuit comprises the following steps: activation of the memory cell in order to connect the storage capacitance to one of the bit lines, thereby bringing about a charge difference between the bit lines of the bit line pair, amplification of the charge difference brought about on the bit lines, and application of a substrate potential dependent on an operating state of the memory circuit to the substrate of the transistor.

The preceding description describes advantageous exemplary embodiments of the invention. The features disclosed therein and the claims and the drawings can, therefore, be useful for realizing the invention in its various embodiments, both individually and in any combination. While the foregoing is directed to embodiments of the present invention, other and further embodiments of this invention may be devised without departing from the basic scope of the invention, the scope of the present invention being determined by the claims that follow.

What is claimed is:

1. An integrated circuit, comprising:
   a bit line pair having two bit lines;
   a sense amplifier having at least one transistor, the sense amplifier amplifying a charge difference between the bit lines of the bit line pair; and
   a control unit connected to a substrate terminal of the at least one transistor, the control unit applying a substrate potential, which is dependent on an operating state of the integrated circuit, to the substrate of the transistor.

2. The integrated circuit as claimed in claim 1, wherein the control unit is configured to apply one of a first substrate potential and a second substrate potential depending on the operating state.

3. The integrated circuit as claimed in claim 1, wherein the sense amplifier is configured to bring one of the bit lines to a high bit line potential and the corresponding other bit line to a low bit line potential, and wherein the control unit is configured to apply a center potential to the substrate of the transistor at least in the case where the sense amplifier is inactivated, the center potential lying between the high and low bit line potentials.

4. A memory circuit, comprising:
- a bit line pair having two bit lines;
- a memory cell having a storage capacitor and a selection transistor, the selection transistor, upon activation, connecting the storage capacitor to one of the bit lines, thereby bringing about a charge difference between the bit lines of the bit line pair;
- a sense amplifier having at least one transistor, the sense amplifier amplifying a charge difference between the bit lines of the bit line pair; and
- a control unit connected to a substrate terminal of the at least one transistor, wherein the control unit is configured to apply a substrate potential dependent on an operating state of the memory circuit to the substrate of the transistor.

5. The memory circuit as claimed in claim 4, wherein the sense amplifier is configured to bring one of the bit lines to a high bit line potential and the corresponding other bit line to a low bit line potential, and wherein the control unit is configured to apply a center potential to the substrate of the transistor at least in the case where the sense amplifier is inactivated, the center potential lying between the high and low bit line potentials.

6. The memory circuit as claimed in claim 5, wherein the center potential is chosen such that a leakage current of the transistor in the case where the sense amplifier is inactivated does not exceed a predetermined threshold value.

7. The memory circuit as claimed in claim 5, wherein the control unit is configured to set the potentials of the bit lines of the bit line pair to an equalize potential in the case where the selection transistor is deactivated, the center potential corresponding to the equalize potential.

8. The memory circuit as claimed in claim 5, wherein the sense amplifier, in the case where the selection transistor is activated, is configured to bring the bit lines of the bit line pair to a correspondingly high and low bit line potential in an amplifying phase and to hold the bit lines at the corresponding bit line potentials in a hold phase.

9. The memory circuit as claimed in claim 8, wherein the sense amplifier includes at least one n-channel field effect transistor.

10. The memory circuit as claimed in claim 9, wherein the control unit is configured to bring the substrate potential of the at least one n-channel field effect transistor to a second potential, which is less than or equal to the low bit line potential, at least during the hold phase.

11. The memory circuit as claimed in claim 9, wherein the control unit is configured to bring the substrate potential of the at least one n-channel field effect transistor, at least during the hold phase, firstly to the low bit line potential and, after a first time duration, to bring the substrate potential to a second potential, which is less than the low bit line potential.

12. The memory circuit as claimed in claim 9, wherein the control unit is configured to bring the substrate potential of the at least one n-channel field effect transistor to the center potential in the case where the sense amplifier is deactivated.

13. The memory circuit as claimed in claim 9, wherein the control unit is configured to bring the substrate potential of the at least one n-channel field effect transistor, in the case where the sense amplifier is deactivated, firstly to the low bit line potential and, after a second predetermined time duration, to bring the substrate potential to the center potential.

14. The memory circuit as claimed in claim 8, wherein the sense amplifier includes a first n-channel field effect transistor and a second n-channel field effect transistor, which are connected in series between the first and second bit lines;
- wherein the first n-channel field effect transistor is connected by a first terminal to the first bit line and the second n-channel field effect transistor is connected by a second terminal to the second bit line;
- wherein second terminals of the n-channel field effect transistors are connected to one another and to a first read-out signal;
- wherein a control terminal of the first n-channel field effect transistor is connected to the second bit line and a control terminal of the second n-channel field effect transistor is connected to the first bit line; and
- wherein the control unit is configured for lowering the first read-out signal during the amplifying phase from the center potential in the direction of the low bit line potential.

15. The memory circuit as claimed in claim 8, wherein the sense amplifier includes at least one p-channel field effect transistor.

16. The memory circuit as claimed in claim 15, wherein the control unit is configured to bring the substrate potential of the at least one p-channel field effect transistor to a third potential, which is greater than or equal to the high bit line potential, at least during the hold phase and at the beginning of the amplifying phase.

17. The memory circuit as claimed in claim 15, wherein the control unit is configured to bring the substrate potential of the at least one p-channel field effect transistor, at least during the hold phase, firstly to the high bit line potential and, after a third time duration, to bring the substrate potential to a third potential, which is greater than the high bit line potential.

18. The memory circuit as claimed in claim 15, wherein the control unit is configured to bring the substrate potential of the at least one p-channel field effect transistor to the center potential in the case where the sense amplifier is deactivated.

19. The memory circuit as claimed in claim 15, wherein the control unit is configured to bring the substrate potential of the at least one p-channel field effect transistor, in the case where the sense amplifier is deactivated, firstly to the high bit line potential and, after a fourth predetermined time duration, to bring the substrate potential to the center potential.

20. The memory circuit as claimed in claim 15, wherein the sense amplifier includes a first and a second p-channel field effect transistor, which are connected in series between the first and second bit lines;
- wherein the first p-channel field effect transistor is connected by a first terminal to the first bit line and the second p-channel field effect transistor is connected by a second terminal to the second bit line;
- wherein second terminals of the p-channel field effect transistors is connected to one another and to a second read-out signal;
- wherein a control terminal of the first p-channel field effect transistor is connected to the second bit line and a control terminal of the second p-channel field effect transistor is connected to the first bit line; and
- wherein the control unit is configured for lowering the second read-out signal during the amplifying phase from the center potential in the direction of the high bit line potential.

21. The memory circuit as claimed in claim 5, wherein the memory circuit is a dynamic memory circuit.

22. A method for operating an integrated circuit comprising a bit line pair having two bit lines, a memory cell having a storage capacitor and having a selection transistor, and a sense amplifier having at least one transistor, the method comprising:

amplifying a charge difference between the bit lines of the bit line pair; and applying a substrate potential which is dependent on an operating state of the integrated circuit to the substrate of the transistor.

23. The method as claimed in claim 22, wherein one of a first substrate potential and a second substrate potential is applied depending on the operating state.

24. The method as claimed in claim 22, wherein the amplification of the charge difference between the bit lines of the bit line pair comprises bringing one of the bit lines to a high bit line potential and the corresponding other bit line to a low bit line potential, and applying a center potential to the substrate of the transistor at least in the case where the sense amplifier is inactivated, the center potential lying between the high and low bit line potentials.

25. The method as claimed in claim 24, wherein the center potential is chosen such that a leakage current of the transistor in the case where the sense amplifier is inactivated does not exceed a predetermined threshold value.

26. The method as claimed in claim 24, further comprising activating of a memory cell in order to connect the storage capacitor to one of the bit lines, thereby bringing about the charge difference between the bit lines of the bit line pair.

27. The method as claimed in claim 26, wherein the potentials of the bit lines of the bit line pair are set to an equalize potential in the case where the selection transistor is deactivated, the center potential corresponding to the equalize potential.

28. The method as claimed in claim 26, wherein, in a case where the selection transistor is activated, the bit lines of the bit line pair are brought to a correspondingly high and low bit line potential in an amplifying phase and the bit lines are held at the corresponding bit line potentials in a hold phase.

29. The method as claimed in claim 26, wherein the sense amplifier includes at least one n-channel field effect transistor, the substrate potential of the at least one n-channel field effect transistor being brought to a second potential, which is less than or equal to the low bit line potential, at least during the hold phase.

30. The method as claimed in claim 26, wherein the substrate potential of the at least one n-channel field effect transistor, at least during the hold phase, firstly is brought to the low bit line potential and, after a first time duration, is brought to a second potential, which is less than the low bit line potential.

31. The method as claimed in claim 26, wherein the substrate potential of the at least one n-channel field effect transistor is brought to the center potential in the case where the sense amplifier is deactivated.

32. The method as claimed in claim 26, wherein the substrate potential of the at least one n-channel field effect transistor, in the case where the sense amplifier is deactivated, firstly is brought to the low bit line potential and, after a second predetermined time duration, is brought to the center potential.

33. The method as claimed in claim 26, wherein the sense amplifier includes a first n-channel field effect transistor and a second n-channel field effect transistor, which are connected in series between the first and second bit lines;

wherein the first n-channel field effect transistor is connected by a first terminal to the first bit line and the second n-channel field effect transistor is connected by a second terminal to the second bit line;

wherein second terminals of the n-channel field effect transistors are connected to one another and to a first read-out signal;

wherein a control terminal of the first n-channel field effect transistor is connected to the second bit line and a control terminal of the second n-channel field effect transistor is connected to the first bit line; and wherein the first read-out signal is lowered during the amplifying phase from the center potential in the direction of the low bit line potential.

34. The method as claimed in claim 26, wherein the sense amplifier includes at least one p-channel field effect transistor, and wherein the substrate potential of the at least one p-channel field effect transistor is brought to a third potential, which is greater than or equal to the high bit line potential, at least during the hold phase.

35. The method as claimed in claim 26, wherein the sense amplifier includes at least one p-channel field effect transistor, and wherein the substrate potential of the at least one p-channel field effect transistor, at least during the hold phase, firstly is brought to the high bit line potential and, after a third time duration, is brought to a third potential, which is greater than the high bit line potential.

36. The method as claimed in claim 34, wherein the substrate potential of the at least one p-channel field effect transistor is brought to the center potential in the case where the sense amplifier is deactivated.

37. The method as claimed in claim 34, wherein the substrate potential of the at least one p-channel field effect transistor, in the case where the sense amplifier is deactivated, firstly is brought to the high bit line potential and, after a fourth predetermined time duration, is brought to the center potential.

38. The method as claimed in claim 34, wherein the sense amplifier includes a first p-channel field effect transistor and a second p-channel field effect transistor, which are connected in series between the first and second bit lines;

wherein the first p-channel field effect transistor is connected by a first terminal to the first bit line and the second p-channel field effect transistor is connected by a second terminal to the second bit line;

wherein second terminals of the p-channel field effect transistors are connected to one another and to a second read-out signal;

wherein a control terminal of the first p-channel field effect transistor is connected to the second bit line and a control terminal of the second p-channel field effect transistor is connected to the first bit line; and wherein the second read-out signal is increased during the amplifying phase from the center potential in the direction of the high bit line potential.

* * * * *